United States Patent [19]
Schuss et al.

[11] Patent Number: 5,568,086
[45] Date of Patent: Oct. 22, 1996

[54] LINEAR POWER AMPLIFIER FOR HIGH EFFICIENCY MULTI-CARRIER PERFORMANCE

[75] Inventors: Jack J. Schuss, Newton; Peter R. Maloney, Norwood, both of Mass.; David M. Upton, Mont Vernon, N.H.; Robert J. McMorrow, Lincoln, Mass.

[73] Assignee: Motorola, Inc., Schaumburg, Ill.

[21] Appl. No.: 450,055

[22] Filed: May 25, 1995

[51] Int. Cl.⁶ .............................. H03F 3/68; H03F 1/36
[52] U.S. Cl. ...................................... 330/124 R; 330/107
[58] Field of Search ........................... 330/124 R, 107, 330/295; 455/127; 333/124, 125, 32, 33

[56] References Cited

U.S. PATENT DOCUMENTS

| | | | |
|---|---|---|---|
| 2,210,028 | 8/1940 | Doherty | 179/171 |
| 3,471,798 | 10/1969 | Seidel | 330/124 R |
| 4,335,363 | 6/1982 | Bowers | 332/37 R |
| 4,588,962 | 5/1986 | Saito et al. | 330/286 |
| 4,590,436 | 5/1986 | Butler | 330/295 |
| 4,916,410 | 4/1990 | Littlefield | 330/295 |
| 5,017,886 | 5/1991 | Geller | 330/277 |
| 5,066,925 | 11/1991 | Freitag | 330/269 |
| 5,083,094 | 1/1992 | Forsberg | 330/124 R |
| 5,166,639 | 11/1992 | Green et al. | 330/294 |
| 5,214,394 | 5/1993 | Wong | 330/286 |
| 5,264,807 | 11/1993 | Okubo | 330/124 R |
| 5,420,541 | 5/1995 | Upton | 330/295 |
| 5,444,418 | 8/1995 | Metzlaff | 330/52 |

OTHER PUBLICATIONS

Three Bazun Designs for Push–Pull Amplifiers Microwave (Jul. 1980) pp. 47–52 vol. 19, No. 7.

*Primary Examiner*—William L. Sikes
*Assistant Examiner*—Tiep H. Nguyen
*Attorney, Agent, or Firm*—Gregory J. Gorrie

[57] ABSTRACT

A Doherty-type power amplifier suitable for satellite telecommunication systems provides linear amplification of noise-like RF signals that have multiple carriers spread over a large instantaneous bandwidth. Efficiencies of 40% to 50% are achieved using PHEMT devices. The power amplifier includes a carrier amplifier that operates a low power levels and a peak amplifier that operates at high power levels. For low power levels, the carrier amplifier delivers its output into twice the optimum load resulting in high efficiency, while the peak amplifier is turned off. At high power levels, both the carrier and the peak amplifier is working into an optimum load and maximum power is delivered. Output matching sections are used to transform the very low optimum load impedance of the PHEMT devices prior to phase shifting and combining.

20 Claims, 1 Drawing Sheet

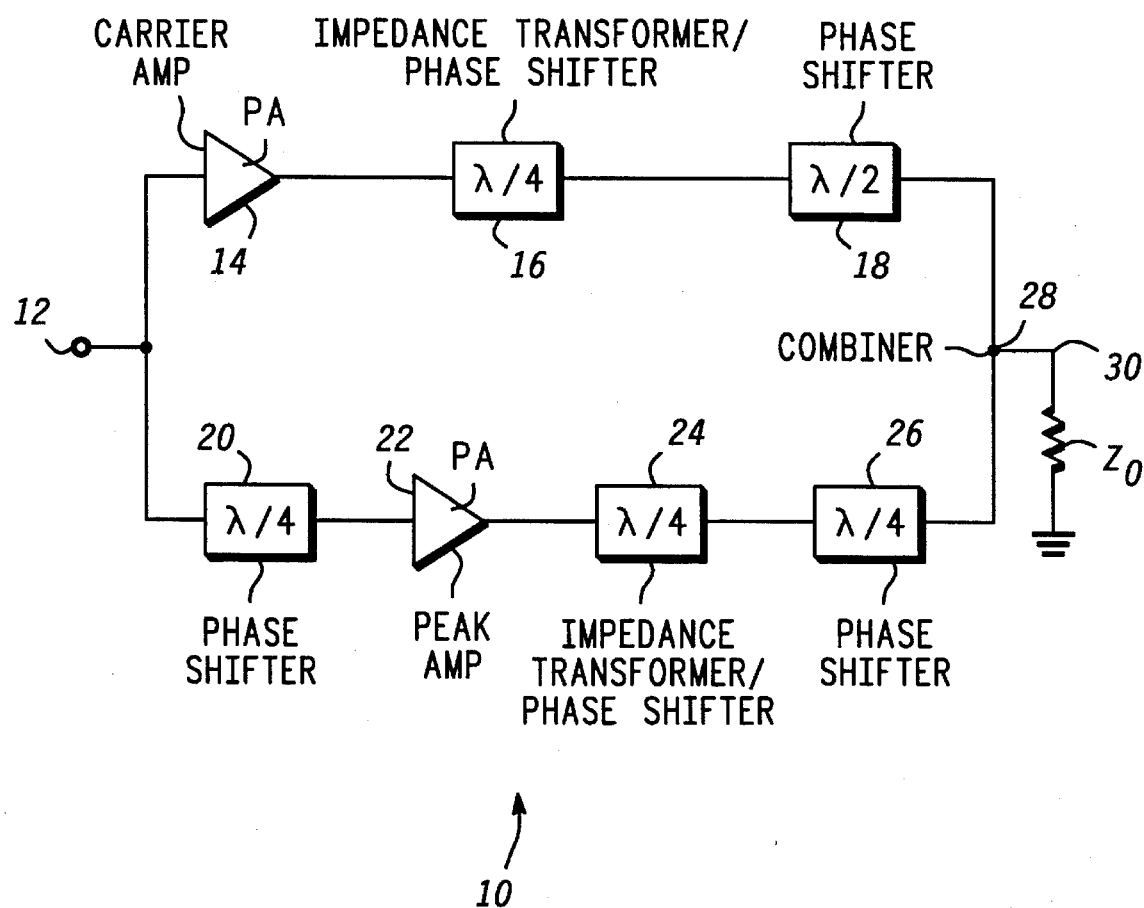

5,568,086

LINEAR POWER AMPLIFIER FOR HIGH EFFICIENCY MULTI-CARRIER PERFORMANCE

FIELD OF THE INVENTION

This invention relates in general to the field of satellite communication systems, in particular to linear power amplifiers, and more particularly to microwave power amplifiers for signals having multiple carrier frequencies.

BACKGROUND OF THE INVENTION

In satellite telecommunication systems, it is desirable for RF power amplifiers to linearly amplify RF signals in a highly efficient manner. However, there are tradeoffs between maximum efficiency and high linearity. Efficiency is generally proportional to input drive level, and high efficiency is usually not attained until an amplifier approaches its maximum output power, which is not consistent with linear operation. Doherty-type amplifiers, for example, achieve an efficiency advantage over standard class AB and class B amplifiers near peak power, in part, because of an instantaneous modulation of their carrier amplifier's loadline as the RF input level changes. In other words, Doherty-type amplifiers exhibit a more benign relationship between input drive level and efficiency because the amplifier's loadline is continuously modified to maintain high efficiency as input drive level changes. In addition, the bias power of Doherty-type amplifiers is greatly reduced over standard class AB and class B amplifiers.

High linearity is generally evidenced by a low level of non-linear intermodulation products. In many situations, the RF signals that need to be amplified in satellite telecommunication systems include multiple carrier frequencies spread over a large instantaneous bandwidth. The noise-like characteristics of these multiple-carrier signals make it difficult to amplify such signals in a linear fashion.

A key issue in operation of multi-carrier linear power amplifiers is the noise-like characteristic of the multiple carrier signals. In the case of single frequency linear power amplifiers, the power amplifier need only respond to constant or near constant envelopes. However, the RF amplitude envelope of noise-like multi-carrier signals changes in time according to the total occupied signal bandwidth. Multi-carrier linear power amplifiers should respond to this changing envelopes in order to obtain high efficiency and linear operation. Therefore, there are additional network design requirements for multi-carrier linear power amplifiers above and beyond that of single frequency linear power amplifiers.

For high power applications, Doherty-type amplifiers have historically been built using vacuum tubes. Problems with vacuum tubes include their size and weight, which are critical in satellite applications. Furthermore, in satellite communication systems that use phased array antennas, vacuum tubes are impractical because many hundreds would be required. In addition, vacuum tubes are generally not compatible with distributed architectures used in most modern microwave circuits.

In lieu of vacuum tubes, Doherty-type amplifiers may be built with high-power field effect transistors (FETs). One difficulty with using high-power FETs is that the Doherty combining network should be matched to the optimum load impedance of the FETs. In general, the optimum load impedance of high power FETs is very low at high power levels making it very difficult to realize the Doherty combining network at this low impedance.

Thus what is needed is a Doherty-type amplifier that eliminates the need to realize the combining network at the low optimum load impedances of the FETs. What is also needed is an RF power amplifier that amplifies multi-carrier noise-like signals suitable for use in a satellite communication system where power consumption is a critical factor. What is also needed is a RF power amplifier that is linear and efficient for multi-carrier noise-like signals. What is also needed is an RF power amplifier having bias circuitry adapted for multi-carrier noise-like signals. What is also needed is a RF power amplifier that is linear and efficient for both continuous wave (CW) carrier signals as well as multi-carrier noise-like signals. What is also needed is a linear and efficient power amplifier that has low bias power consumption, and is lightweight and manufacturable.

SUMMARY OF THE INVENTION

The present invention provides, among other things, a power amplifier circuit for linearly amplifying signals. The power amplifier circuit includes a carrier amplifier for amplifying low signal levels and producing first signals, a first impedance transforming network coupled to an output of the carrier amplifier, a first phase shifter coupled to the first impedance transformer section for phase shifting the fist signals one half-wavelength and a second phase shifter for phase shifting signals a quarter wavelength. The second phase shifter is coupled to the input of the power amplifier circuit. The power amplifier circuit also includes a peak amplifier having an input coupled to the first quarter-wavelength section for amplifying the high signal levels and producing second signals. The power amplifier circuit also includes a second impedance transforming network coupled to an output of the peak amplifier, a third phase shifter coupled to the second impedance transformer section for phase shifting the second signals a quarter-wavelength, and a combiner for combining the first signals and the second signals to produce an output signal.

The present invention also provides a method of amplifying a multi-carrier signal of low and high power levels. The method includes the steps of amplifying the low power levels of the multi-carrier signal in a carrier amplifier to produce a first signal, and transforming the first signal in a first quarter-wave transformer section. The first quarter-wave transformer section transforms an optimum load impedance of the carrier amplifier to a normalized impedance. The method also includes the steps of phase shifting the first signal by a half-wavelength, phase shifting the multi-carrier signal by a quarter-wavelength to produce a second signal, amplifying the second signal in a peak amplifier, and transforming the second signal in a second quarter-wave transformed section. The second quarter-wave transformer section transforms an optimum load impedance of the peak amplifier to a normalized impedance. The method also includes the steps of phase shifting the second signal by a quarter-wavelength and combining the first and second signals to produce an output signal.

BRIEF DESCRIPTION OF THE DRAWING

The invention is pointed out with particularity in the appended claims. However, a more complete understanding of the present invention may be derived by referring to the detailed description and claims when considered in connection with the figure.

FIG. 1 shows a block diagram of a hybrid power amplifier in accordance with the present invention.

The exemplification set out herein illustrates a preferred embodiment of the invention in one form thereof, and such exemplification is not intended to be construed as limiting in any manner.

DETAILED DESCRIPTION OF THE DRAWING

The present invention provides, among other things, a power amplifier that linearly amplifies noise-like multi-carrier signals over a wide range of power levels. The present invention also provides a high efficiency RF power amplifier suitable for use in satellite telecommunication systems. The present invention also provides an RF power amplifier that does not require realization of a Doherty-type combining network at the low optimum load impedances of high power field effect transistors (FETs). The present invention also provides an RF power amplifier that reduces the losses associated with the use of lumped elements. The present invention also provides an RF power amplifier that reduces the problems associated with lumped element realization of low impedance matching networks. The present invention also provides an RF power amplifier that significantly reduces the amount of circuit real estate on Gallium Arsenide (GaAs) substrate, which, among other things, results in significant cost savings.

In general, high power Doherty-type amplifiers that use devices such as FETs have the Doherty combining network realized at the same impedance as the optimum load impedance of the devices. As the output power of the devices increase, their optimum load impedance drops significantly to around a couple of ohms. The combining network of the Doherty-type configuration traditionally has been realized at these very low impedances to match to the optimum load impedance of the devices. However, it is very difficult to realize combining networks at these low impedances. As is shown below, the present invention eliminates the requirement of building combining network at these very low impedances.

On the other hand, low power FET devices, generally have optimum load impedances on the order of 25 to 50 ohms, depending on the type of FET. These low power devices designed to operate with a power output of under 1 watt include FETs with gate peripheries of 500 to 1000 microns. In contrast, a FET designed for high power applications may have a gate width on the order of 5 to 20 mm (5000 to 20,000 microns). These much larger high power devices generally have optimum load impedances of only a few ohms. Unfortunately, it is difficult to realize output matching networks at these low impedances. High power amplifiers built with vacuum tubes did not have this difficulty because the output impedance of vacuum tubes are generally much higher.

Furthermore, larger FETs become difficult to characterize in low impedance media. For example, low losses occur when the output network is on alumina with a thickness of 0.015 inches rather than on GaAs with a thickness of 0.004 inches. The area required for the combining network increases substantially on alumina and becomes unwieldy.

FIG. 1 is shows a block diagram of a hybrid power amplifier in accordance with the present invention. Amplifier 10 includes input port 12 for receiving input signals. Carrier amplifier 14 is coupled to input port 12. Carrier amplifier 14 desirably operates at low input signal power levels. Carrier amplifier 14 is desirably a field effect transistor (FET) and preferably a pseudomorphic high electron mobility transistor (PHEMT). MESFETs, heterostructure field effect transistors (H-FETs), HEMTs, and other three terminal devices may also be used. Carrier amplifier 14 desirably has a gate width or periphery of between 10 and 20 millimeters, and preferably around 15 millimeters. Carrier amplifier 14 is desirably biased as a class "B" amplifier, or a class "AB" amplifier. The resulting optimum load impedance of carrier amplifier 14 at high output power levels is approximately two ohms.

The output of carrier amplifier 14 (i.e. the drain) is coupled to an impedance transforming network such as output matching transformer section 16. Output matching transformer section 16 is preferably a quarter wave transformer having an impedance of $Z_M$ where:

$$Z_M = \sqrt{2Z_o Z_{opt}}$$

and where $Z_{opt}$ is the optimum load impedance of carrier amplifier 14 and $Z_o$, the output load impedance 30, is preferably 25 ohms but may be 50 or 75 ohms. Transformer section 16 transforms the optimum load impedance of carrier amplifier 14 from approximately 2 ohms to 50 ohms (or $2Z_o$). Transformer section 16 is coupled to a phase shifter such as half-wavelength section 18. Half-wavelength section 18 is preferably a half-wavelength transmission line having an impedance of $2Z_o$. Those of skill in the art will understand that half-wavelength section 18 may be fabricated in many ways including combining of two quarter-wavelength sections. For example, section 18 may be two of quarter-wavelength section 26 (discussed below) combined.

Amplifier 10 also includes a second phase shifter such as quarter-wavelength section 20 coupled to input port 12. Quarter-wavelength section 20 is preferably a quarter-wave transmission line that shifts an input signal ninety degrees in phase. Those of skill in the art will understand that when a signal includes a range of frequencies, some frequencies may be shifted slightly more than ninety degrees while others may be shifted slightly less than ninety degrees depending on the design of the quarter wave line.

Quarter wavelength section 20 is coupled to the input of peak amplifier 22. Quarter wavelength section 20 preferably has an impedance of 50 ohms to match the input impedance of peak amplifier 22. Peak amplifier 22 desirably operates at high input signal power levels relative to those at which carrier power amplifier 14 operates. In the preferred embodiment, peak amplifier 22 is of the same type and substantially identical to carrier amplifier 14. Preferably, peak amplifier 22 is matched with carrier amplifier 14 and may be fabricated from the same die lot. Preferably, both carrier amplifier 14 and peak amplifier 22 are built as two good class "B" amplifiers which exhibit suitable efficiency and intermodulation performance, and have independent bias variability. Preferably, the insertion phase of carrier amplifier 14 and peak amplifier 22 is controlled or well matched.

Peak amplifier 22, however, is biased differently from carrier amplifier 14. Desirably, peak amplifier 22 is preferably biased similar to a class "C" amplifier. Because of this bias condition, peak amplifier 22 is pinched off (turned off) at low signal levels and its output looks like an open circuit, and it's output impedance is infinity. Those of ordinary skill in the art understand how to design devices for the amplifiers having the above discussed characteristics. The output of peak amplifier 22 (i.e., the drain) is coupled to an impedance transforming network such as output matching transformer section 24. Output matching transformer section 24 is preferably a quarter wave transformer having an impedance of $Z_M$ where:

$$Z_M = \sqrt{2Z_o Z_{opt}}$$

and where $Z_{opt}$ is the optimum load impedance of peak amplifier 22, and $Z_o$, the output load impedance, is preferably 25 ohms. Transformer section 24 transforms the optimum load impedance of peak amplifier 22 from approximately 2 ohms to 50 ohms (or $2Z_o$). Transformer section 24 is coupled to quarter-wavelength section 26. The impedance preferably remains $2Z_o$ in section 26. Quarter-wavelength section 26 is preferably a quarter-wavelength transmission line having an impedance of $2Z_o$.

The outputs of sections 18 and 26 are combined in a reactive combiner 28 which is coupled to output port 30 of amplifier 10. The impedance at output port 30 is preferably $Z_o$, which results from combining both output impedances of $2Z_o$ of sections 18 and 26.

Amplifier 10 may be built on a single gallium arsenide (GaAs) substrate. In the preferred embodiment, only carrier amplifier 14 and peak amplifier 22 are built on a GaAs substrate. Preferably, the devices used for amplifiers 14 and 22 are fabricated with tapered feeds on the input and/or output to help eliminate distributive effects that result from the amplifiers size. Output matching transformer section 16, half-wavelength section 18, transformer section 24 and quarter-wavelength sections 20 and 26 are desirably fabricated on a separate substrate such as beryllia ($\epsilon=6.6$), alumina ($\epsilon=10$) or K38. Preferably beryllia is used because of it's high thermal conductivity. Those of skill in the art will understand that other substrates may also be suitable.

The operation of amplifier 10 is best understood in two extremes - low signal power levels and high signal power levels. At low power levels there is not enough RF power to turn on peak amplifier 22. At low power levels, carrier amplifier 14 delivers its power into twice the optimum load. As a result, carrier amplifier 14 saturates at half of its maximum output power while providing a high efficiency.

At these low power levels, peak amplifier 22 is pinched off and the output of peak amplifier 22 looks like an open circuit. As a result of transformer section 24 and quarter-wavelength section 26, the open circuit output of peak amplifier 22 looks like an open circuit at reactive combinet 28. Therefore, at low signal levels, the open circuit optimum load impedance of peak amplifier 22 does not affect the load for carrier amplifier 14. Without quarter-wavelength section 26, the open circuit optimum load impedance of peak amplifier 22 would result in an RF short at reactive combiner 28, and amplifier 10 would not operate well. Thus, there is no inversion of the output impedance of peak amplifier 22 at the combiner.

When there is sufficient power to fully turn on both carrier amplifier 14 and peak amplifier 22, both amplifiers are working into an optimum load and maximum power is delivered. Peak efficiency is again achieved at this point.

In between the point where carrier amplifier 14 is operating at low RF signal levels and the point where peak amplifier 22 is fully turned on, peak amplifier 22 gradually becomes active as the RF signal level increases. During this time, the load seen by carrier amplifier 14 changes from $2Z_{opt}$ to $Z_{opt}$ where $Z_{opt}$ is the optimum load impedance of the carrier amplifier and is approximately two ohms. The load seen by the carrier amplifier changes because the optimum load impedance of the peak amplifier gradually changes from an open circuit as the RF drive level increases and the peak amplifier turns on. As the impedance seen at the reactive combiner looking into the output of the peak amplifier changes from an open circuit, the impedance by the carrier amplifier also changes (i.e., due in part to section 18) eventually reaching a value of $Z_{opt}$ at full power. The result of the changing load is that carrier amplifier 14 is kept at the onset of saturation until the peak amplifier becomes saturated. Thus, amplifier 10 effectively allows 6 dB of power amplification beyond the point where a normal class "B" amplifier begins to saturate, and over this range, the efficiency remains close to maximum efficiency.

The drain bias circuitry of standard linear power amplifiers is often designed to obtain drain currents that vary almost proportionally to RF signal amplitude in order to maintain efficient operation at both high and low signal amplitudes. However, when noise-like signals are injected into these amplifiers, the drain current varies with a bandwidth similar to that of the RF bandwidth. This generally results in large drain voltage changes which severely degrades linearity and efficiency.

The drain bias circuits for carrier amplifier 14 and peak amplifier 22 are chosen so that the component of drain current at the noise signal bandwidth is bypassed. With this bias configuration, the drain current does not vary with bandwidth, but varies more proportionally with RF signal level. As a result, efficiency is greatly enhanced. For example, a larger storage capacitance may be located near each of the drains. Desirably, both the drain and the gate bias circuitry are designed for low DC resistance and low impedance over the modulation bandwidth. Preferably, the bias circuitry has good RF and video frequency decoupling. Those of skill in the art will be able to design the appropriate bias circuitry to meet the principles discussed above. In the preferred embodiment, the drain bias is injected through a quarter-wave line with a large capacitor (e.g., 33 uF) coupled in parallel to an RF bypass capacitor.

In the embodiment discussed above, amplifier 10 has a gain between 7 and 13 dB and preferably between 10 and 12 dB, with an output power of between 3 and 6 watts. Efficiencies of 40% to 50% at an output power level of approximately 3.2 watts are realized using Fujitsu MESFET devices. These results are realized at a noise power ratio of approximately 16 dB. In the preferred embodiment, the gain of amplifier 10 ranges from about 8.3 dB at small signal levels to 10.1 dB at peak signals levels. Better performance is achieved using PHEMT devices. For example, power amplifier 10 obtains a gain of between 11 and 12 dB and a power out of between 3 and 6 watts using PHEMT devices.

While the embodiment discussed above is preferably fabricated on GaAs, any or all components may be built using lumped elements.

Thus a power amplifier has been described that is able to handle noise-like multi-carrier signals and is able to operate efficiently over a wide range of signal power levels. This power amplifier is suitable for use in satellite based telecommunication systems where efficiency is critical because of limited battery and solar power. Further, this power amplifier is suitable for use in cellular telecommunication systems that use multiple carrier frequencies spread over a large instantaneous bandwidth.

The present invention overcomes specific problems and accomplishes certain advantages relative to prior art methods and mechanisms. For example, it is no longer necessary to realize Doherty combining networks at very low optimum load impedances (i.e., to match that of the FETs). High losses associated with these lumped element networks are virtually eliminated. The improvements over known technology are significant. Prior art power amplifiers did not require matching to very-low optimum load impedances because prior art Doherty-type power amplifiers, for example, used vacuum tubes which have significantly higher optimum load impedance. The present invention, among other things, eliminates the need for vacuum tubes. The expense, complexities, and high cost of using vacuum tubes are avoided.

In addition, the amount of real estate on a semiconductor substrate, such as GaAs or silicon is significantly reduced because the transformer sections, the quarter-wave and the half-wavelengths can be built on a separate substrate, such as Beryllia. As a result, significant cost savings are realized.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A power amplifier circuit for linearly amplifying signals comprising:
   a carrier amplifier for amplifying input signals and producing first signals, said carrier amplifier coupled to an input of said power amplifier circuit;
   a first impedance transforming network coupled to an output of the carrier amplifier;
   a first phase shifter coupled to the first impedance transformer section for phase shifting said first signals one half-wavelength;
   a second phase shifter for phase shifting said input signals a quarter wavelength, said second phase shifter coupled to said input of said power amplifier circuit;
   a peak amplifier having an input coupled to the first quarter-wavelength section for amplifying said input signals and producing second signals;
   a second impedance transforming network coupled to an output of the peak amplifier;
   a third phase shifter coupled to the second impedance transformer section for phase shifting said second signals a quarter-wavelength; and
   a combiner for combining said first signals and said second signals to produce an output signal.

2. A power amplifier as claimed in claim 1 wherein said carrier amplifier is biased to provide amplification of said input signals at low power levels, and wherein said peak amplifier is biased to be turned off at said low power levels and provide amplification of said input signals at high power levels.

3. A power amplifier as claimed in claim 1 wherein said combiner comprises a reactive combiner coupled to said half-wavelength section and said second quarter-wavelength section.

4. A power amplifier as claimed in claim 1 wherein
   the first and second impedance transforming networks are impedance transformers, the first phase shifter is a half-wavelength section, the second and third phase shifters are quarter-wavelength sections;
   the impedance transformers, the half-wavelength section and the quarter-wavelength sections are fabricated on either a beryllia or alumina substrate; and
   the peak and carrier amplifiers are fabricated on either a gallium arsenide (GaAs) or silicon substrate.

5. A power amplifier as claimed in claim 4 wherein said carrier amplifier and said peak amplifier is made from heterostructure field effect transistor (H-FET) devices having a gate width between 10.0 and 20.0 millimeters, said carrier amplifier is biased to turn on at low power levels of said input signals, and said peak amplifier is biased to turn on at high power levels of said input signals and turn off at said low power levels.

6. A power amplifier as claimed in claim 4 wherein said carrier amplifier and said peak amplifier is made from pseudomorphic high electron mobility transistor (PHEMT) devices having a gate width between 10.0 and 15.0 millimeters, said carrier amplifier is biased to turn on at low power levels of said input signals, and said peak amplifier is biased to turn on at high power levels of said input signals and turn off at said low power levels.

7. A power amplifier as claimed in claim 6 wherein said signals are multi-carrier signals having noise-like characteristics, said power amplifier having a gain of between 7 and 11 dB, and said power amplifier having a power out of between 3 and 5 watts.

8. A power amplifier as claimed in claim 7 wherein said power amplifier has a gain of between 11 and 12 dB and a power out of between 3 and 6 watts.

9. A power amplifier as claimed in claim 1 wherein the second and third phase shifters transform an optimum load impedance of said carrier and peak amplifiers to a normalized impedance of approximately 50 ohms.

10. A method of amplifying a multi-carrier signal of low and high powerlevels comprising the steps of:
    (a) amplifying said low power levels of said multi-carrier signal in a carrier amplifier to produce a first signal;
    (b) transforming said first signal in a first quarter-wave transformer section, said first quarter-wave transformer section for transforming an optimum load impedance of said carrier amplifier to a normalized impedance;
    (c) phase shifting said first signal by a half-wavelength;
    (d) phase shifting said multi-carrier signal by a quarter-wavelength to produce a second signal;
    (e) amplifying said second signal in a peak amplifier;
    (f) transforming said second signal in a second quarter-wave transformer section, said second quarter-wave transformer section for transforming an optimum load impedance of said peak amplifier to a normalized impedance;
    (g) phase shifting said second signal by a quarter-wavelength; and
    (h) combining said first and second signals to produce an output signal.

11. A method as claimed in claim 10 wherein said carrier amplifier and said peak amplifier is made from heterostructure field effect transistor (H-FET) devices having a gate width between 10 and 15.0 millimeters, said carrier amplifier is biased to turn on at said low power levels, and said peak amplifier is biased to turn on at said high power levels and turn off at said low power levels.

12. A method as claimed in claim 10 wherein said carrier amplifier and said peak amplifier is made from pseudomorphic high electron mobility transistor (PHEMT) devices having a gate width between 10.0 and 15.0 millimeters, said carrier amplifier is biased to turn on at said low power levels, and said peak amplifier is biased to turn on at said high power levels and turn off at said low power levels.

13. A method as claimed in claim 12 wherein:

step (b) is performed by said first quarter wave transformer section coupled to an output of said carrier amplifier that is biased to turn on at said low power levels;

step (c) is performed by a half-wavelength section that is coupled to said first quarter wave transformer section;

step (d) is performed by a first quarter-wavelength section;

step (f) is performed by said second quarter wave transformer section that is coupled to an output of said peak amplifier;

step (g) is performed by a second quarter-wavelength section that is coupled to said first quarter wave transformer section; and step (h) is performed by a reactive combiner.

14. A method as claimed in claim 13 wherein sid multi-carrier signal is multi-carrier signal having noise-like characteristics, and wherein said method amplifies said multi-carrier signal between 11 and 12 dB, and provides a power out of between 3 and 6 watts.

15. A method amplifier as claimed in claim 14 wherein the first and second quarter-wave transformer sections, the half-wavelength section, and the first and second quarter-wavelength sections are fabricated on either a beryllia or alumina substrate, and the peak and carrier amplifiers are fabricated on either a gallium arsenide (GaAs) or silicon substrate.

16. A power amplifier circuit for amplifying multi-carrier signals having an input and an output port comprising:

a carrier amplifier coupled to the input port;

a first quarter-wavelength section coupled to the input port;

peak amplifier having an input coupled to the first quarter-wavelength section;

a first impedance transformer section coupled to an output of the carrier amplifier;

a second impedance transformer section coupled to an output of the peak amplifier;

a half-wavelength section coupled to the first impedance transformer section; and a second quarter-wavelength section coupled to the second impedance transformer section, wherein the half-wavelength section and the second quarter-wavelength section are coupled together to form the output port.

17. A power amplifier as claimed in claim 16 wherein said carrier amplifier is biased to provide amplification of said multi-carrier signals at low power levels, and wherein said peak amplifier is biased to be turned off at said low power levels and provide amplification of said multi-carrier signals at high power levels.

18. A power amplifier as claimed in claim 17 further comprising a reactive combiner coupled to said half-wavelength section and said second quarter-wavelength.

19. A power amplifier as claimed in claim 18 wherein the first and second impedance transformer sections, the half-wavelength section, and the first and second quarter-wavelengths are fabricated on either a beryllia or alumina substrate, and the peak amplifier and the carrier amplifier are fabricated on either a gallium arsenide (GaAs) or silicon substrate.

20. A power amplifier as claimed in claim 19 wherein said multi-carrier signals have noise-like characteristics, and wherein said power amplifier has a gain of between 11 and 12 dB and has a power out of between 3 and 6 watts.

* * * * *

UNITED STATES PATENT AND TRADEMARK OFFICE
CERTIFICATE OF CORRECTION

PATENT NO. : 5,568,086
DATED : October 22, 1996
INVENTOR(S) : Jack J. Schuss et al.

It is certified that error appears in the above-identified patent and that said Letters Patent is hereby corrected as shown below:

In column 8, claim 10, line 31, delete "powerlevels" and insert --power levels--.

In column 8, claim 11, line 57, delete "10" and insert --10.0--.

In column 9, claim 14, line 17, delete "sid" and insert --said--.

Signed and Sealed this

Twenty-third Day of September, 1997

Attest:

BRUCE LEHMAN

Attesting Officer

Commissioner of Patents and Trademarks